United States Patent
Trevor et al.

(10) Patent No.: US 10,535,492 B2
(45) Date of Patent: *Jan. 14, 2020

(54) ELECTRON ENERGY LOSS SPECTROMETER USING DIRECT DETECTION SENSOR

(71) Applicant: Gatan, Inc., Pleasanton, CA (US)

(72) Inventors: Colin Trevor, Pleasanton, CA (US); Matthew Lent, Livermore, CA (US); Alexander Jozef Gubbens, Palo Alto, CA (US); Edward James, San Francisco, CA (US); Ray Dudley Twesten, Livermore, CA (US); Roice Joseph, Mountain House, CA (US); SanJay Parekh, Dublin, CA (US); Thomas Sha, San Leandro, CA (US)

(73) Assignee: GATAN, INC., Warrendale, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/960,924

(22) Filed: Apr. 24, 2018

(65) Prior Publication Data

US 2018/0240639 A1 Aug. 23, 2018

Related U.S. Application Data

(63) Continuation of application No. 15/411,194, filed on Jan. 20, 2017, now Pat. No. 9,966,220.

(Continued)

(51) Int. Cl.
*H01J 37/05* (2006.01)
*H01J 37/22* (2006.01)
(Continued)

(52) U.S. Cl.
CPC ............ *H01J 37/05* (2013.01); *H01J 37/222* (2013.01); *H01J 37/244* (2013.01);
(Continued)

(58) Field of Classification Search
CPC ........ H01J 37/05; H01J 37/222; H01J 37/244; H01J 37/256; H01J 37/26; H01J 37/28;
(Continued)

(56) References Cited

U.S. PATENT DOCUMENTS

| | | | | |
|---|---|---|---|---|
| 7,728,294 | B2 * | 6/2010 | Hiroi | G01R 31/307 250/306 |
| 8,592,762 | B2 * | 11/2013 | Luecken | H01J 37/244 250/306 |

(Continued)

*Primary Examiner* — David E Smith
(74) *Attorney, Agent, or Firm* — Snyder, Clark, Lesch & Chung, LLP

(57) ABSTRACT

An electron energy loss spectrometer is described having a direct detection sensor, a high speed shutter and a sensor processor wherein the sensor processor combines images from individual sensor read-outs and converts a two dimensional image from said sensor into a one dimensional spectrum and wherein the one dimensional spectrum is output to a computer and operation of the high speed shutter is integrated with timing of imaging the sensor. The shutter is controlled to allow reduction in exposure of images corresponding to the individual sensor readouts. A plurality of images are exposed by imaging less than the full possible exposure and wherein the plurality of images are combined to form a composite image. The plurality of images can be comprised of images created by exposing the sensor for different exposure times.

15 Claims, 5 Drawing Sheets

Related U.S. Application Data

(60) Provisional application No. 62/281,147, filed on Jan. 20, 2016.

(51) Int. Cl.
  *H01J 37/244* (2006.01)
  *H01J 37/26* (2006.01)
  *H01J 37/256* (2006.01)
  *H01J 37/28* (2006.01)

(52) U.S. Cl.
  CPC ............ *H01J 37/256* (2013.01); *H01J 37/26* (2013.01); *H01J 37/28* (2013.01); *H01J 2237/05* (2013.01); *H01J 2237/057* (2013.01); *H01J 2237/24485* (2013.01); *H01J 2237/24495* (2013.01); *H01J 2237/2802* (2013.01)

(58) Field of Classification Search
  CPC ..... H01J 2237/2446; H01J 2237/24485; H01J 2237/24495; H01J 2237/24585; H01J 2237/2802
  See application file for complete search history.

(56) References Cited

U.S. PATENT DOCUMENTS

| | | | |
|---|---|---|---|
| 8,809,781 B1* | 8/2014 | Bammes | H01J 37/26 250/306 |
| 9,966,220 B2* | 5/2018 | Trevor | H01J 37/05 |
| 2009/0194691 A1* | 8/2009 | Kaji | H01J 37/244 250/311 |
| 2015/0301196 A1* | 10/2015 | Gubbens | G01T 1/2018 250/362 |

* cited by examiner

ELECTRON ENERGY LOSS SPECTROMETER USING DIRECT DETECTION SENSOR

CROSS-REFERENCE TO RELATED APPLICATIONS

This application is a continuation of U.S. patent application Ser. No. 15/411,194 filed on Jan. 20, 2017, which application claims benefit under 35 U.S.C. 119(e) of provisional application No. 62/281,147 filed on Jan. 20, 2016, the disclosures of which are both hereby incorporated by reference herein.

BACKGROUND OF THE INVENTION

In an exemplary electron microcopy system having a direct detection sensor, the sensor runs at a constant speed such as 400 frames or sensor readouts per second (fps). Each sensor readout is processed by dedicated hardware in the camera to determine the location of each electron striking the detector. For this to work, in each of these sensor readouts the count rate in any area must remain below approximately one electron per twenty pixels or miscounting occurs. Read-out noise is eliminated by the electron-counting process. The system is designed such that incident electrons create a spatially-localized signal at a much higher level than the localized noise associated with read-out of the sensor. By applying a threshold to the signal, counting events above the threshold and negating noise below the threshold the read noise is eliminated. Under the above conditions, noise due to errors in counting such as false positives or missed counts is minimal. When used in an imaging mode this noise minimization, together with low spatial spread of the signal orthogonal to the incident beam, yields an excellent detective quantum efficiency. On a conventional direct detection camera system, the 400 fps data rate is far higher than a typical computer could process. One way to solve this problem is for the processing hardware to sum a number (e.g. 40) of counted frames together before sending the data to the host computer, thus yielding an effective summed-frame rate of 10 fps or an effective exposure time of 0.1 s per recorded summed-frame.

In this example for an electron microscope used in imaging mode, the minimum exposure is 0.1 seconds, the maximum summed-frame rate to the computer is 10 fps and the maximum dose rate is 20 electrons per second per pixel.

For electron-energy-loss spectroscopy (EELS) the above limitations are problematic. In a conventional, non-counting, scintillator-based detector, the spectrum is spread out in the non-spectral direction (also called the non-dispersive direction) by a few hundred pixel rows. This value is determined by balancing the competing needs of a high readout speed and low noise, requiring a smaller readout area, and the need for dynamic range and detector lifetime, requiring a larger readout area. Spectroscopy experiments often require high dynamic range to simultaneously detect regions of the spectrum that differ widely in intensity. Incident currents in the pico-Amp range on localized detector regions are common. This corresponds to many millions of electrons per second per pixel, which is much higher than the dose rate capacity of approximately 20 electrons per second per pixel shown above for the direct-detection detector when imaging in counting mode.

Spreading the spectrum out to less than the full height of the detector decreases the sensor read-out time since fewer pixels are read but, for a direct detection device in counting mode, the narrow spectrum reduces the dynamic range by the same amount that it increases the speed so in most cases there is no advantage in limiting the spectrum to smaller areas. Reducing the area does, however, reduce the lifetime of the detector so the optimal use of the detector is when the full detector is used, that is, when the spectrum spread out in both directions as in FIG. 1. Such counting-mode operation performs EELS in the absence of read-out noise and, therefore, at very high sensitivity. The invention described herein is designed to address the difficulties described above that can limit the summed frame rate and dose rate for spectroscopy.

This application is related to and incorporates by reference PCT application serial number PCT/US2015/037712 titled Electron Energy Loss Spectrometer filed by applicant Gatan, Inc.

DETAILED DESCRIPTION OF THE PREFERRED EMBODIMENTS

A novel Electron Energy Loss Spectroscopy (EELS) system is disclosed using a direct electron detector coupled to a spectrometer aimed at both imaging and spectroscopy.

Figure 1:
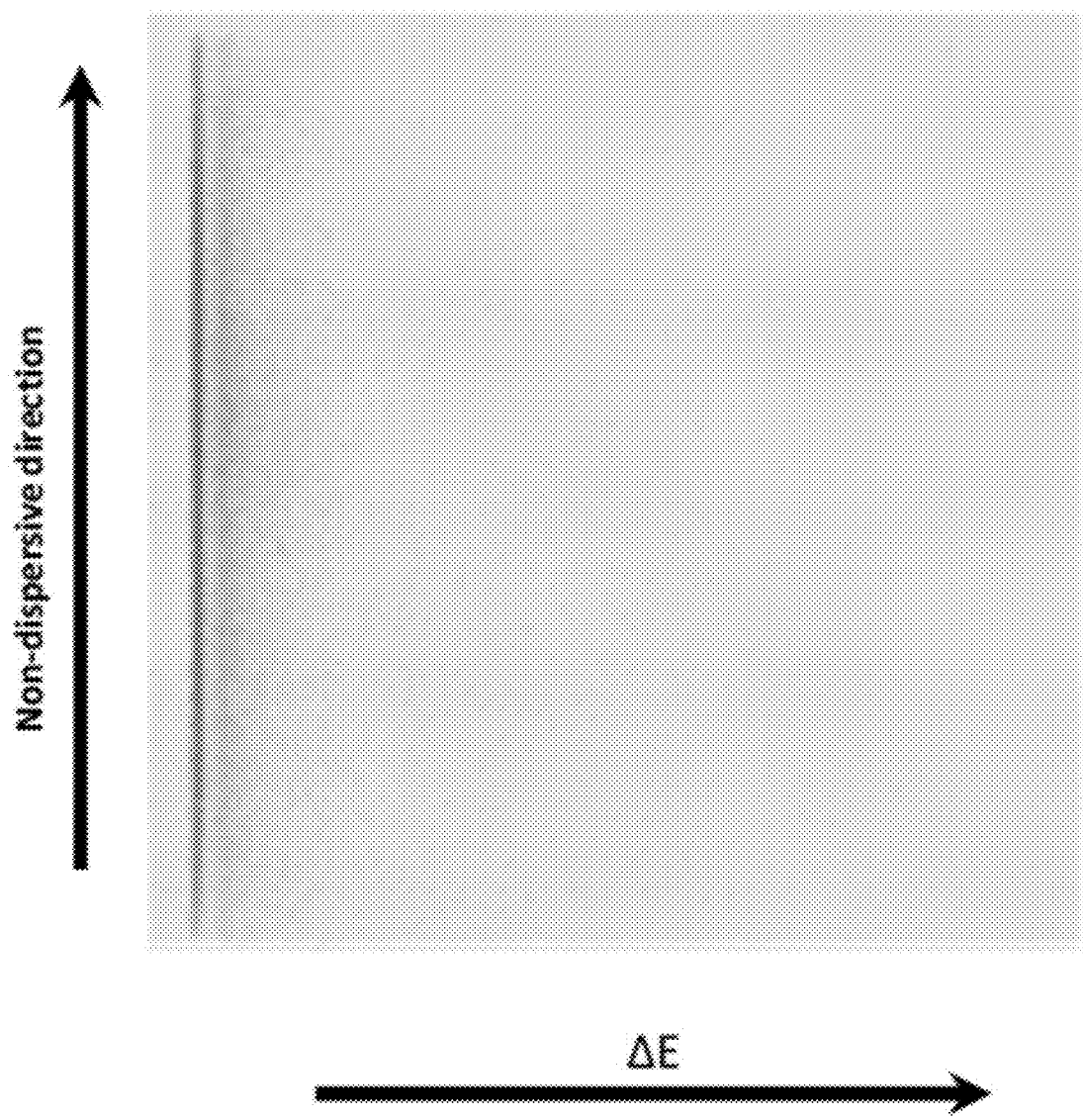
FIG. 1 is an image of a spectrum on a two dimensional direct electron detector.
Figure 2:
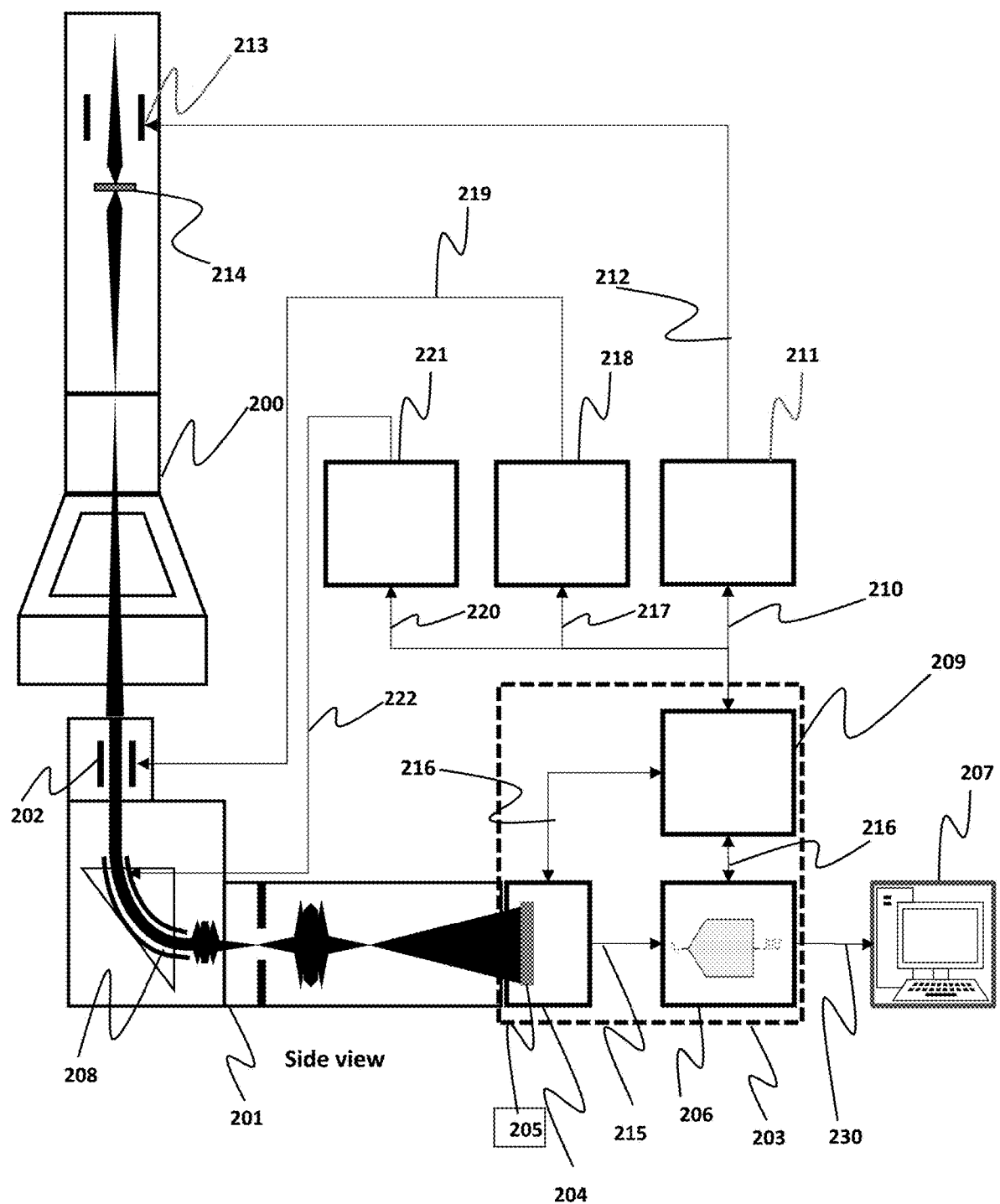
FIG. 2 is a block diagram of the preferred embodiment of the invention.

FIG. 2 shows an exemplary system for performing the inventive process. As shown, the exemplary system includes a Transmission Electron Microscope (TEM) or Scanning Transmission Electron Microscope (STEM) 200 that includes a scan control element 213 and scan control electronics 211 with a scan amplifier output signal 212 connected to scan control element 213. A sample 214 is shown placed in the microscope 200.

Consistent with embodiments described herein, the system further includes a high speed shutter 202, controlled by a shutter driver 218 via control signal 219; an imaging filter 201, which comprises an energy offset drift tube 208, controlled by a drift tube driver 221 via control signal 222; and a direct detector camera system 203.

Direct detector camera system 203 comprises a direct detector module 204 comprising a direct detector sensor 205, a direct detector camera processing module 206 and a direct detector camera controller module 209. As shown in FIG. 2, image/spectrum data path 215 is provided from direct detector module 204 to direct detector camera processing module 206. FIG. 2 further shows the direct detector camera internal synchronization signals 216 between the direct detector camera controller module 209 and the direct detector camera processing module 206. The direct detector camera controller module 209 is further connected to and controls the scan control electronics 211 via a scanning pixel advance signal 210, the direct detector module 204 via direct detector camera internal synchronization signals 216, the drift tube driver 221 via control signal 220 and the shutter driver 218 via control signal 217. The output image or spectrum data 230 of the direct detector camera module 206 is connected to a host computer system 207.

In the past, only imaging was possible on such systems. Using a counting mode with a detector has a number of advantages for spectroscopy. The two biggest advantages are that detector noise is much lower, allowing lower intensity signals to be measured and that the detector is a transmission detector so the point spread function is much tighter, giving sharper spectra. This means the system can be used at lower dispersions, that is more energy-loss (in electron-Volts, eV) per pixel. This increases the number of electrons per channel and hence reduces the shot noise in the spectrum and increases the spectral field of view, or energy range, for a given detector size in pixels.

The major elements of the system are imaging filter 201 having a high speed shutter and a direct electron detector, such as a K2 camera from Gatan, Inc. This combination is shown in FIG. 2 and has been used before for imaging but not spectroscopy because of a number of practical difficulties using a direct detector for recording a spectrum.

The inventive system improves imaging efficiency. Instead of each frame having the same exposure, the inventive system varies the exposure, using the high speed shutter, and only uses the regions in the spectrum that were taken under appropriate counting conditions. This is most clearly seen in an example comparing two methods of acquiring and combining multiple images.

In a first method, there is a fixed exposure time, such that 100 sensor readouts of 1 microsecond-exposure are summed, with a total time for acquiring data of approximately 0.25 seconds (e.g., 100 full-height frames at 400 fps), total live exposure time is 100 microseconds.

A second method according to the embodiments described herein uses a varying or stepped exposure times, such as 10 sensor readouts at 1 microsecond-exposure and 9 sensor readouts at 10 microseconds-exposure. These sensor readouts are summed and the two spectra are combined. This second method allows for the same live exposure time of 100 microseconds on the fainter image areas, but only requires 19 sensor readouts to be summed and takes only approximately 0.05 seconds to acquire. This is five times faster than the simple exposure mode of the first method.

Summed-Frame Rate Limitation for Spectra-Per-Second

Figure 3:
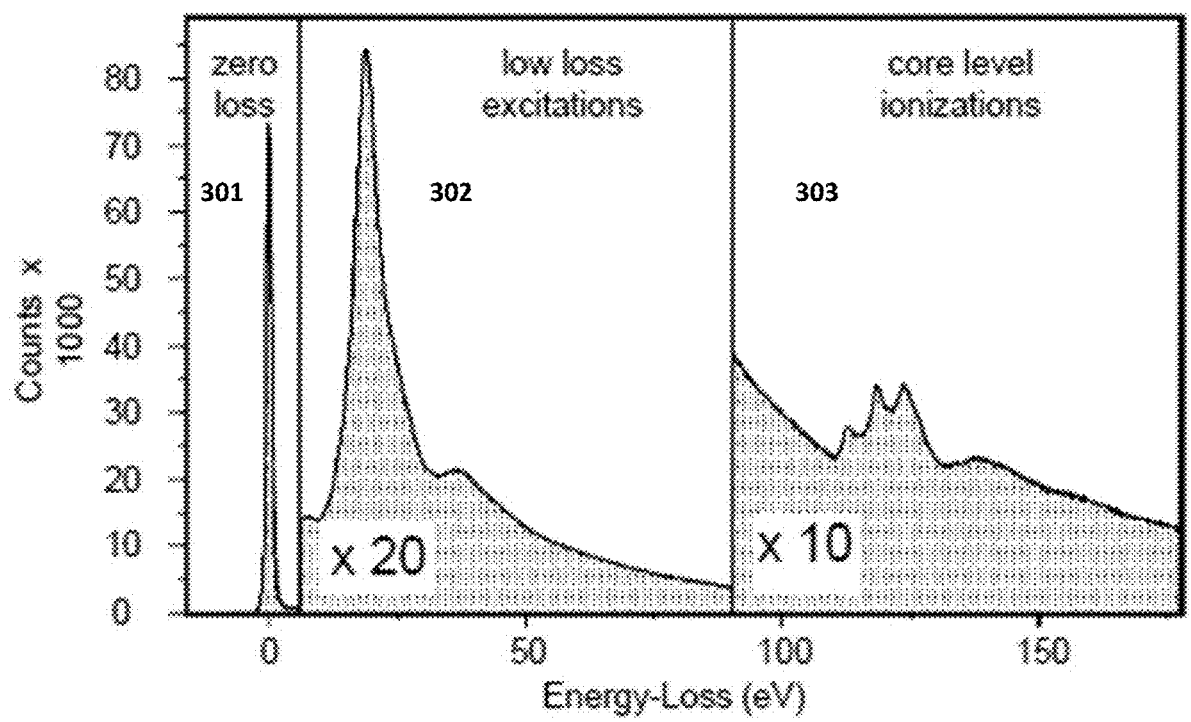
FIG. 3 is diagram illustrating a typical EELS spectrum.

In the imaging mode of operation, the frame rate is limited by the data path and processing power of the computer. However, in a spectroscopy mode of operation, the final spectrum is a projection of such a 2-D image along the non-dispersive direction as shown in FIG. 3. In the inventive system, this projection is performed in the data processing module 206 of direct detector camera system 203, as shown in FIG. 2, and a 1-D spectrum is then transferred from data processing module 206 to the host computer 207, which reduces the data load by a factor of the pixel height of the detector.

In some implementations, this difference is a factor of approximately 4,000. This dramatic reduction in data load means that the need to sum multiple sensor readout frames in the processing unit and transmit the resulting summed-frames to the host computer is no longer required and the full 400 spectra per second can be transferred to the host computer without being limited by the data connection bandwidth or the computer processing power. In this case the data rate change would be a combination of a reduction of 4,000× for the projection and an increase in 40× since all projected sensor readout frames are sent to the host computer individually, instead of one summed-frame every 40 read-out frames, leading to a total reduction in the data rate versus the imaging mode of 100× with an increase in the spectra-per-second rate to the computer of 40×.

Dose Rate Limit

In imaging mode operation of a microscope, the dose rate is limited by the microscope optics and the type of image. The brightest area in any direct-detector sensor readout must be below the counting limit of approximately one electron per twenty detector pixels as described above in the Background, a typical intensity variation of each frame in this mode of operation is modest (typically on the order of 10%).

For EELS data, however, large dynamic ranges are typically present (on the order of $10^4$), and it is certain that for some areas of the spectrum, the intensity will be too high to count. This limitation can be overcome by the use of high speed shutter 202 to limit the total number of electrons impinging on the detector. An exemplary spectrometer device based on imaging filter 201 has a shutter 202 that allows exposures as short as 1 microsecond (or 1 millionth of a second) to be acquired. This shutter control is integrated with the direct detection camera system 203 to allow reduction of the intensity in each 1/400 second sensor frame read-out up to 2,500×.

In this way, the counting regime can be maintained even for very bright areas. The simplest use of this mode is to acquire a single sensor readout frame with an exposure of between 1 microsecond and 2.5 milliseconds. For exposure above 2.5 millisecond the high-speed shutter 202 is just left open and sensor readout frames are summed within the data processing module 206. Any number of these sensor readout frames can be summed to give the final spectrum, either fully exposed sensor readouts or attenuated dose sensor readouts.

Dose Efficiency

When using the high-speed shutter 202 to maintain all areas on the direct detector 205 in the counting regime, efficiency can be low. If the shutter is running at its minimum exposure time of 1 microsecond, then the system is only detecting 1/2,500 of the possible signal. On a typical system, this would only be needed for the zero-loss region and the low loss region of the spectrum. A typical EELS spectrum is shown in FIG. 3, with the zero-loss region 301, the low loss region 302 and the core loss region 303.

In a single sensor readout frame the zero loss may have a reasonable number of counts, but even the low loss (also known as the plasmon) area intensity is so low that shot noise hides the real signal. This can be solved most simply by summing sensor readouts, but again this is inefficient and when taking a spectrum image (that is, acquiring a spectrum at every point in an image in Scanning Transmission Electron Microscopy (STEM) mode), sensor readout frame summing slows the process down to the point the experiment becomes impractical.

Dual EELS

On a non-direct detection version of an EELS spectrometer, a mode called Dual EELS is implemented wherein a single readout two spectra are recorded on two different areas of the detector with both a variation of exposure and a variation of energy between the two spectra. The energy may be varied via use of a drift tube within the spectrometer held at elevated voltage. The use of two separate detector areas has the additional effect of avoiding after-glow from the scintillator response from an intense low-loss signal interfering with the weaker signal from the core-loss region.

On a direct detection system, as disclosed herein, shifting areas has no advantage as direct detection does not show the afterglow a scintillator shows, and using the full area of the direct detector 205 is the optimal way to use the detector in most use cases.

An exemplary embodiment of the invention, as shown in FIG. 2, enables the varying exposure mode controller of the system 209 to also control the energy offset device of the system. The result is that the camera controller can be programed to acquire multiple energy ranges with varying exposures in each range.

Complex Exposure Mode Controller

Figure 4:
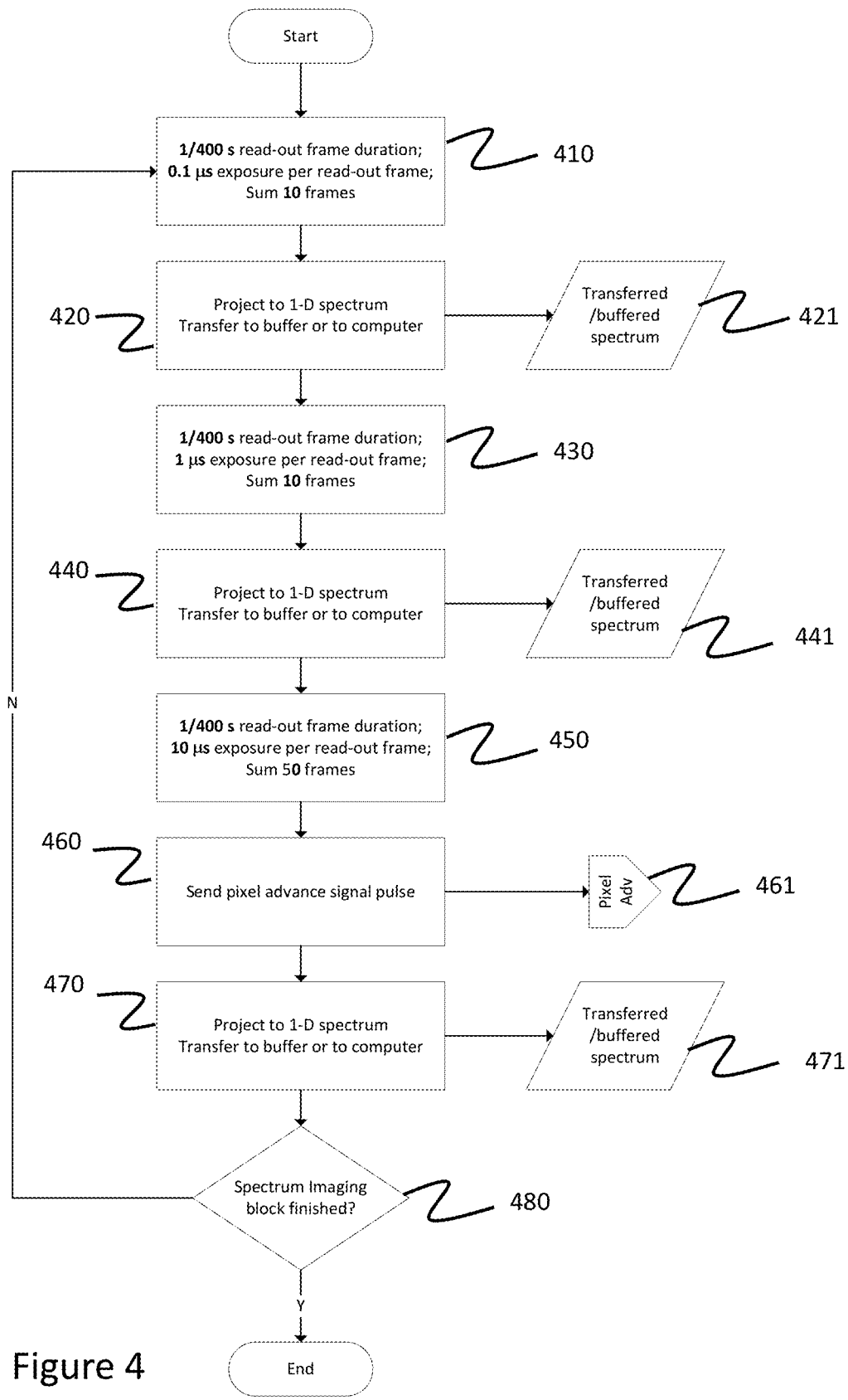
FIG. 4 is a flow chart of an exemplary complex exposure mode as described herein.

An exemplary method 400 for operating an EELS that includes direct detection sensor 205, is shown in FIG. 4, wherein the variable exposure mode is controlled the direct detector camera controller 209. As described herein, process 400 may be implemented by camera controller 209 or a combination of camera controller 209 with direct detector camera processing module 206, and/or host computer system 207. In this implementation, multiple (e.g. 5) exposures can be set up in a sequence. Each separate exposure can have the fast shutter exposure time set per sensor read-out frame. The number of sensor readout frames to sum and the energy offset of the spectrum are programed as separate values for each of the five or fewer exposures. In some embodiments, the direct detector camera controller 209 also controls the scanning pixel advance signal 210 that drives electronics to move the STEM electron probe to the next point for analysis in STEM spectrum imaging, thus fully controlling the EELS acquisition experiment. In this way a spectrum image can be acquired with optimal acquisition time for the entire data set.

Initially, a set of ten 0.1 micro second exposures are made and summed with a setting of 1/400 s read-out frame duration (block 410). Next, the summed frames are converted to a one-dimensional spectrum, this 1D spectrum data 421 is transferred to a buffer or to host computer system 207 (block 420).

A set of ten 1 micro second exposures are made and summed with a setting of 1/400 s read-out frame duration (block 430). Next, the summed frames are converted to a one-dimensional spectrum, this 1D spectrum data 441 is transferred to a buffer or to computer system 207 (block 440).

At block 450, a set of 50 10 microsecond exposures are made and summed with a setting of 1/400 s read-out frame duration. At block 460 a pixel advance signal pulse 461 is sent. Next, the summed frames are converted to a one-dimensional spectrum (block 470), this 1D spectrum data is transferred to a buffer or to host computer system 207 (block 471). Next, a determination is made as to whether the spectrum imaging block is complete (block 480) and, if not, the process may return to block 410 for a next set of read-out frames.

Figure 5:
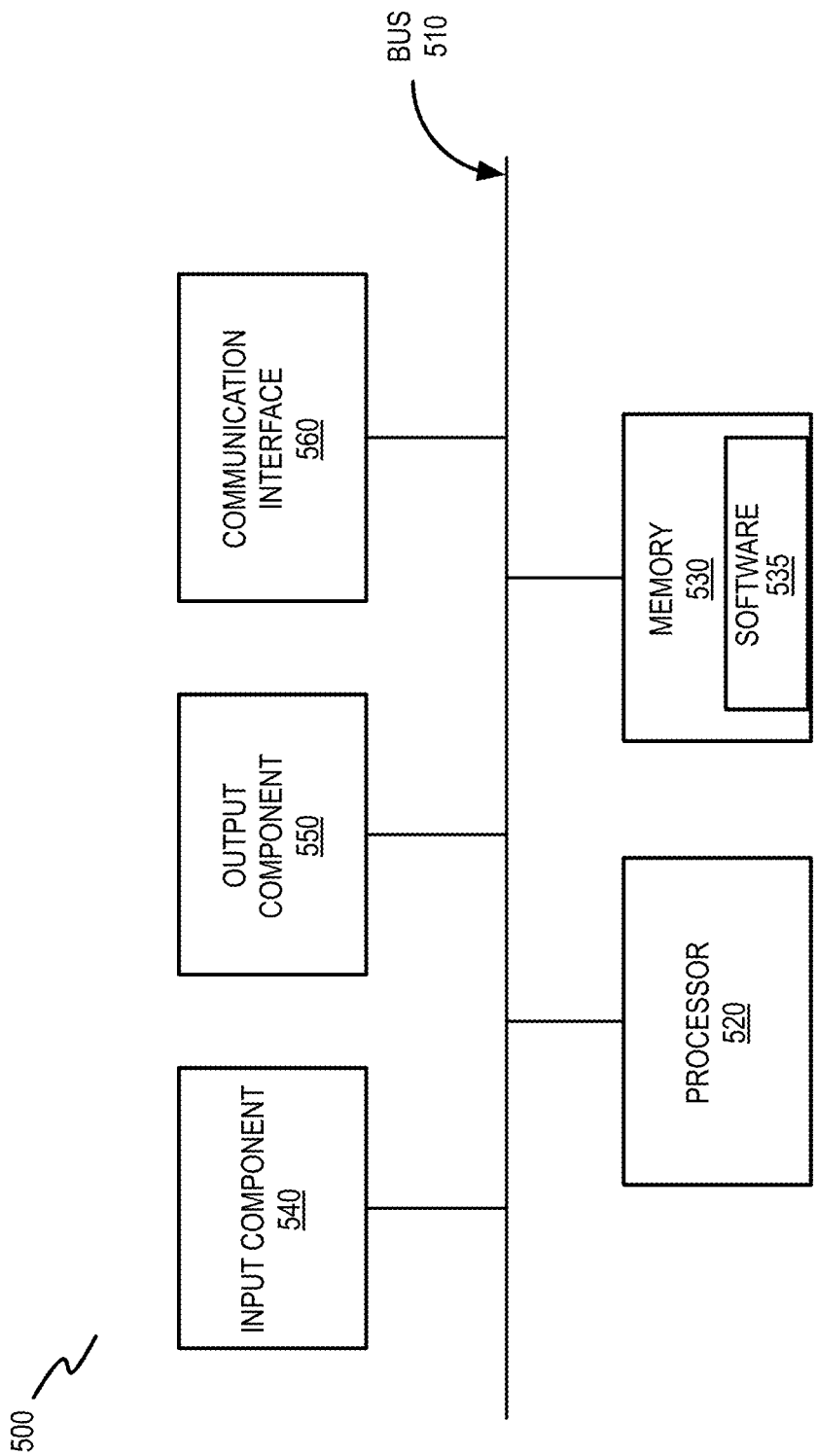
FIG. 5 is a block diagram of an exemplary system.

FIG. 5 is a diagram illustrating exemplary physical components of a device 500. Device 500 may correspond to various devices within the above-described system, such as direct detector camera system 203, host computer 207, etc. Device 500 may include a bus 510, a processor 520, a memory 530, an input component 540, an output component 550, and a communication interface 560.

Bus 510 may include a path that permits communication among the components of device 500. Processor 520 may include a processor, a microprocessor, or processing logic that may interpret and execute instructions. Memory 530 may include any type of dynamic storage device that may store information and instructions, for execution by processor 520, and/or any type of non-volatile storage device that may store information for use by processor 520.

Software 535 includes an application or a program that provides a function and/or a process. Software 535 is also intended to include firmware, middleware, microcode, hardware description language (HDL), and/or other form of instruction. By way of example, with respect to the network elements that include logic to provide proof of work authentication, these network elements may be implemented to include software 535. Additionally, for example, device 500 may include software 535 to perform tasks as described above with respect to FIG. 4.

Input component 540 may include a mechanism that permits a user to input information to device 500, such as a keyboard, a keypad, a button, a switch, etc. Output component 550 may include a mechanism that outputs information to the user, such as a display, a speaker, one or more light emitting diodes (LEDs), etc.

Communication interface 560 may include a transceiver that enables device 500 to communicate with other devices and/or systems via wireless communications, wired communications, or a combination of wireless and wired communications. For example, communication interface 560 may include mechanisms for communicating with another device or system via a network. Communication interface 560 may include an antenna assembly for transmission and/or reception of RF signals. In one implementation, for example, communication interface 560 may communicate with a network and/or devices connected to a network. Alternatively or additionally, communication interface 560 may be a logical component that includes input and output ports, input and output systems, and/or other input and output components that facilitate the transmission of data to other devices.

Device 500 may perform certain operations in response to processor 520 executing software instructions (e.g., software 535) contained in a computer-readable medium, such as memory 530. A computer-readable medium may be defined as a non-transitory memory device. A non-transitory memory device may include memory space within a single physical memory device or spread across multiple physical memory devices. The software instructions may be read into memory 530 from another computer-readable medium or from another device. The software instructions contained in memory 530 may cause processor 520 to perform processes described herein. Alternatively, hardwired circuitry may be used in place of or in combination with software instructions to implement processes described herein. Thus, implementations described herein are not limited to any specific combination of hardware circuitry and software.

Device 500 may include fewer components, additional components, different components, and/or differently arranged components than those illustrated in FIG. 5. As an example, in some implementations, a display may not be included in device 500. In these situations, device 500 may be a "headless" device that does not include input component 540. As another example, device 500 may include one or more switch fabrics instead of, or in addition to, bus 510. Additionally, or alternatively, one or more components of device 500 may perform one or more tasks described as being performed by one or more other components of device 500.

Although different implementations have been described above, it is expressly understood that it will be apparent to persons skilled in the relevant art that the implementations may be modified without departing from the spirit of the invention. Various changes of form, design, or arrangement may be made to the invention without departing from the spirit and scope of the invention. Therefore, the above mentioned description is to be considered exemplary, rather than limiting, and the true scope of the invention is that defined in the following claims.

The term "comprises/comprising" when used in this specification is taken to specify the presence of stated features, integers, steps or components but does not preclude the presence or addition of one or more other features, integers, steps, components, or groups thereof.

No element, act, or instruction used in the present application should be construed as critical or essential to the implementations described herein unless explicitly described as such. Also, as used herein, the article "a" is intended to include one or more items. Further, the phrase "based on" is intended to mean "based, at least in part, on" unless explicitly stated otherwise.

What is claimed is:

1. An electron energy loss spectrometer comprising:
   a direct detection sensor operating in a counting mode directly exposed to an electron spectrum projected in two dimensions along dispersive and non-dispersive axes; and
   a sensor processor receiving a sensor readout frame from said direct detection sensor representative of said electron spectrum in two dimensions,
   wherein said sensor processor converts said sensor readout frame into a one-dimensional spectrum, and
   wherein said sensor processor outputs said one dimensional electron spectrum to an external device.

2. The electron energy loss spectrometer of claim 1 further comprising:
   a high speed shutter; and
   a controller,
   wherein said controller integrates operation of said high speed shutter with read out timing of said direct detection sensor.

3. The electron energy loss spectrometer of claim 2, wherein said controller is configured to obtain a plurality of sensor readout frames by exposing the direct detection sensor to said electron spectrum at exposures controlled by said high speed shutter for each individual sensor readout frame, and wherein said plurality of sensor readout frames are combined.

4. The electron energy loss spectrometer of claim 3, wherein said controller is configured to obtain said plurality of sensor readout frames such that said plurality of sensor readout frames comprises at least one sensor readout frame created by exposing said direct detection sensor for a first exposure time and at least one additional sensor readout frame created by exposing said direct detection sensor for a second exposure time that is different than said first exposure time.

5. The electron energy loss spectrometer of claim 4, wherein said sensor processor is configured to combine said plurality of sensor readout frames to form the one-dimensional spectrum.

6. The electron energy loss spectrometer of claim 2 further comprising:
   a drift tube having a drift tube voltage wherein said controller is configured to integrate control of said drift tube voltage with said readout timing of said direct detection sensor.

7. The electron energy loss spectrometer of claim 6, wherein said controller is further configured to integrate control of said high speed shutter with control of said drift tube voltage.

8. The electron energy loss spectrometer of claim 7 wherein said controller is configured to:
   obtain a first plurality of sensor readout frames at a first drift tube voltage comprising at least a first sensor readout frame created by exposing said direct detection sensor for a first exposure time and at least a second sensor readout frame created by exposing said direct detection sensor for a second exposure time that is different than said first exposure time; and
   obtain a second plurality of sensor readout frames at a second drift tube voltage comprising at least a third sensor readout frame created by exposing said direct detection sensor for said first exposure time and at least a fourth sensor readout frame created by exposing said direct detection sensor for said second exposure time.

9. The electron energy loss spectrometer of claim 6, further comprising:
   scan control electronics controlled by a pixel advance signal and wherein said controller is further configured to integrate control of said pixel advance signal with said read out timing of said direct detection sensor.

10. A method of acquiring an electron energy loss spectrum comprising:
    exposing a direct detection sensor operating in a counting mode to an electron spectrum projected in two dimensions along dispersive and non-dispersive axes;
    receiving a sensor readout frame from said direct detector sensor representative of said electron spectrum in the two dimensions;
    converting said sensor readout frame into a one-dimensional spectrum; and
    transmitting said one dimensional spectrum to an external device.

11. The method claim 10 further comprising:
    integrating read out timing of the direct detection sensor with control of said exposing by a high speed shutter.

12. The method of claim 11, further comprising:
    acquiring a plurality of sensor readout frames by exposing the direct detection sensor to said electron spectrum, wherein each exposure is controlled by said high speed shutter; and
    combining said plurality of sensor readout frames.

13. The method of claim 12, wherein:
    said plurality of sensor readout frames comprises at least one sensor readout frame created by exposing said direct detection sensor for a first exposure time and at least one additional sensor readout frame created by exposing said direct detection sensor for a second exposure time that is different than said first exposure time.

14. The method of claim 11 further comprising:
    integrating control of a drift tube voltage with said read out timing of said direct detection sensor and control of said high-speed shutter with control of said drift tube voltage.

15. The method of claim 14 further comprising:
    acquiring a first plurality of sensor readout frames at a first drift tube voltage comprising at least a first sensor readout frame created by exposing said direct detection sensor for a first exposure time and at least a second sensor readout frame created by exposing said direct detection sensor for a second exposure time that is different than said first exposure time; and
    acquiring a second plurality of sensor readout frames at a second drift tube voltage comprising at least a third sensor readout frame created by exposing said direct detection sensor for said first exposure time and at least a fourth sensor readout frame created by exposing said direct detection sensor for said second exposure time.

* * * * *